United States Patent [19]

Chemin et al.

[11] 4,263,617
[45] Apr. 21, 1981

[54] SYSTEM FOR THE TRANSMISSION OF A COMPOSITE TELEVISION SIGNAL

[75] Inventors: Henri Chemin; Claude Cluniat; Bernard Beltzer, all of Paris, France

[73] Assignee: L.G.T. Laboratoire General des Telecommunications, Chatou, France

[21] Appl. No.: 76,776

[22] Filed: Sep. 18, 1979

[30] Foreign Application Priority Data

Sep. 22, 1978 [FR] France .................. 78 27255

[51] Int. Cl.³ .............................. H04N 5/38
[52] U.S. Cl. .................................. 358/186
[58] Field of Search ...................... 358/186, 160

[56] References Cited
U.S. PATENT DOCUMENTS 4,168,511  9/1979  Chabanel .................. 358/186

Primary Examiner—Richard Murray
Attorney, Agent, or Firm—Roland Plottel

[57] ABSTRACT

The transmission system essentially involves separate amplification followed by a combination under predetermined conditions of relative amplitude and phase, of a carrier signal modulated by the video-frequency information and having a reduced carrier level with the same unmodulated carrier, thus permitting a considerable improvement in both efficiency and reliability of conventional transmitters.

12 Claims, 13 Drawing Figures

Fig_1

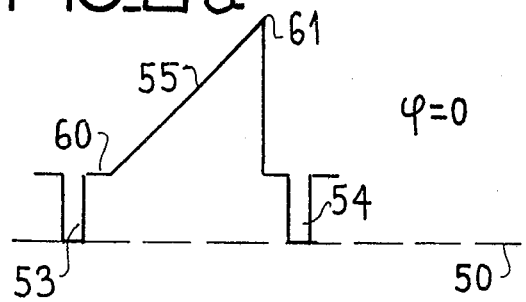
FIG_3-a
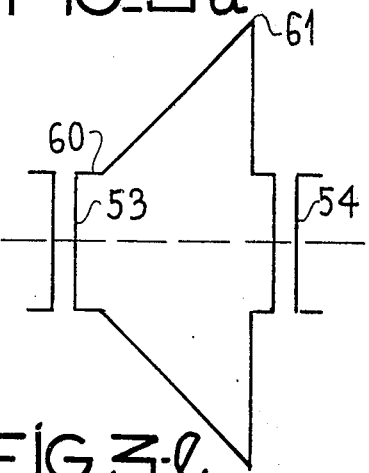
FIG_3-d
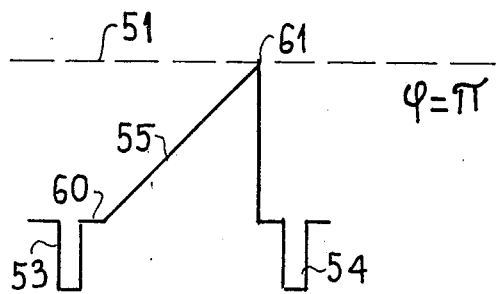
FIG_3-b
FIG_3-e
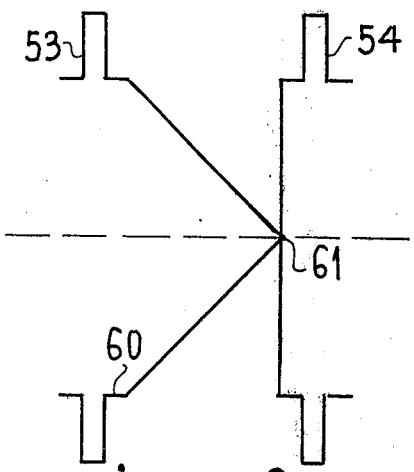
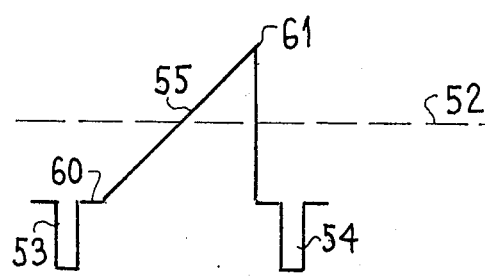
FIG_3-c
FIG_3-f
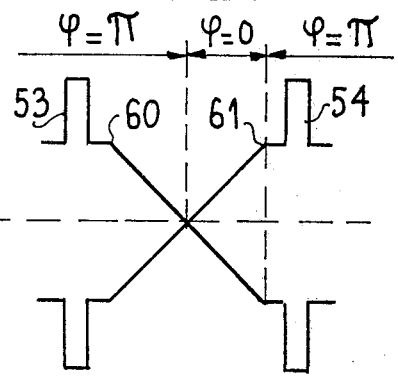

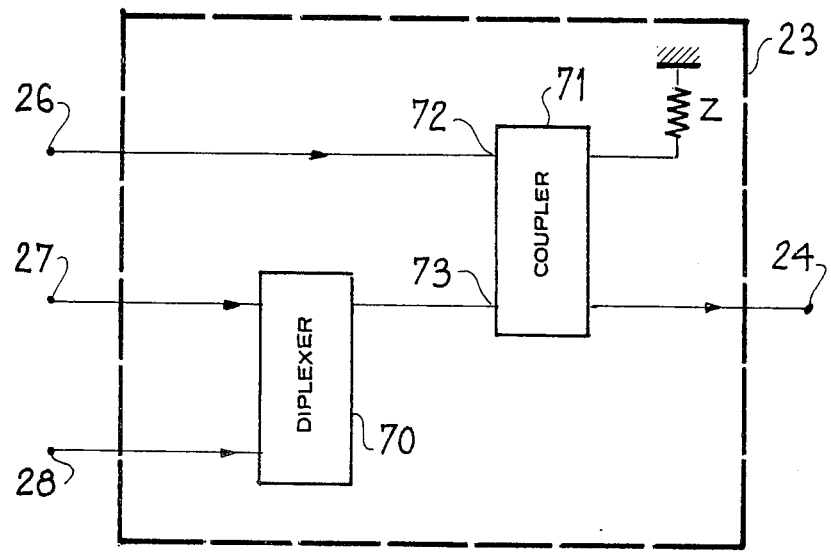
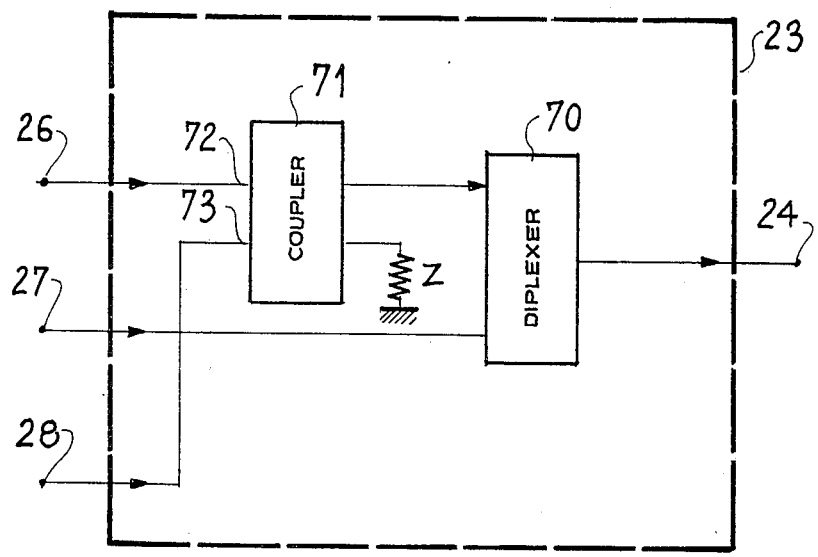

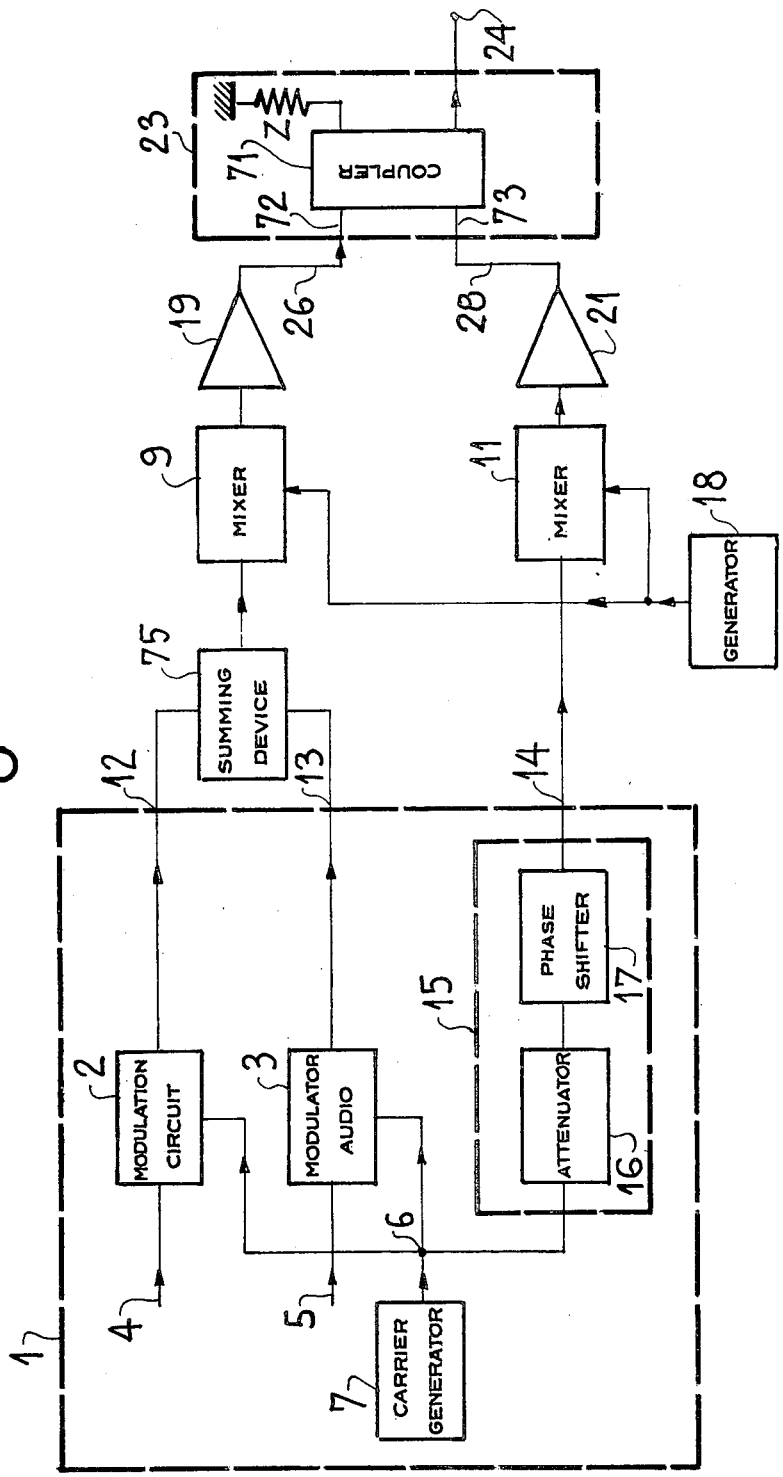

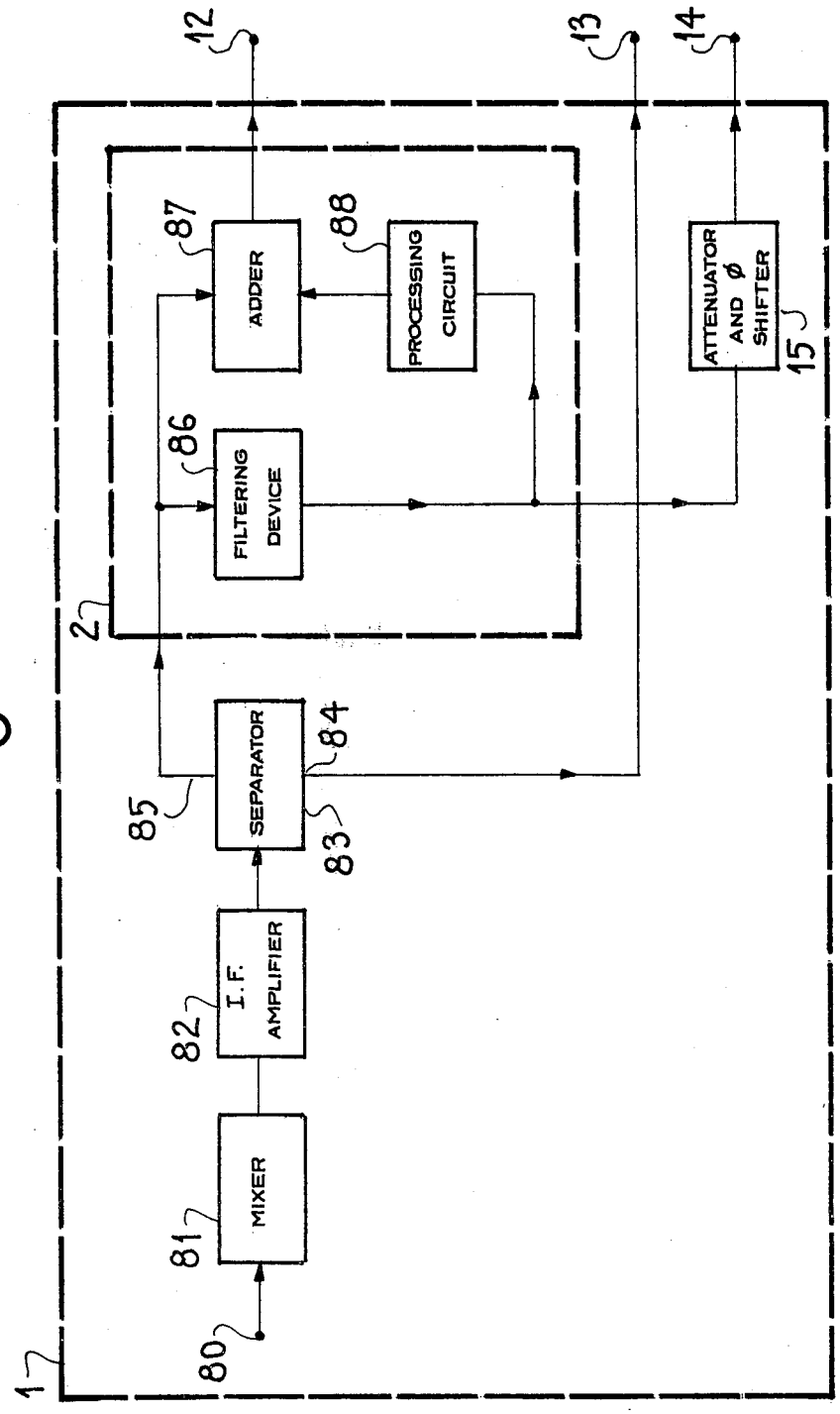

SYSTEM FOR THE TRANSMISSION OF A COMPOSITE TELEVISION SIGNAL

This invention relates to amplitude-modulated transmission systems and more especially to transmitters and rebroadcasting transmitters for either black-and-white or color television.

It is known that any amplitude-modulated transmitter must satisfy conditions of amplitude linearity of the modulated signal with respect to that of the modulation signal.

When a normal carrier level is transmitted as is the case with television transmitters, the conditions of linearity just mentioned are satisfied only on condition that the input level of the power amplifiers at the modulation peak is established at a value distinctly below the saturation level; the difference should not be less than 2 or 3 dB in the case of a power amplifier which is common to audio and video-frequency signals, even when linearity correction devices are taken into account.

As consequence of the foregoing, the overall peak efficiency is of the order of 18% in very-high-frequency (VHF) and ultra-high-frequency (UHF) waves, for example. This also results in a severe limitation of the maximum available power of transistorized power amplifiers.

The aim of the present invention is to overcome these disadvantages and to make it possible at equal power to achieve a higher degree of reliability as well as lower cost of equipments and of their operation.

The invention is accordingly directed to a system for the transmission of a composite television signal comprising:

a generating device for delivering two carrier signals modulated respectively by the audio and video-frequency information constituting the television signal, at least one first and one second amplification channel, and a summing device having at least two inputs coupled respectively to the outputs of the first and second amplification channels and one output constituting the transmission system output.

The generating device comprises a modulation circuit and a processing circuit, the outputs of which deliver respectively the carrier signal amplitude-modulated by the video-frequency signals with a reduced video-frequency carrier signal level, and an unmodulated carrier signal, the outputs of the modulation circuit and of the processing circuit being coupled respectively to the inputs of the first and second amplification channels.

Further distinctive features will become apparent from the following description which will serve to gain a more complete understanding of the invention, reference being made to the accompanying drawings in which:

FIG. 1 illustrates one example of construction of a television transmitter comprising a transmission system in accordance with the invention;

FIGS. 2, 4 and 5 relate to embodiments of elements shown in FIG. 1;

FIGS. 3a to 3f are explanatory diagrams;

FIGS. 6 and 7 illustrate alternative embodiments of the transmitter shown in FIG. 1;

FIG. 8 is a schematic diagram of a portion of a television rebroadcasting transmitter comprising a television system in accordance with the invention.

In these drawings, any reference which is common to a number of figures designates the same element.

Figure 1:
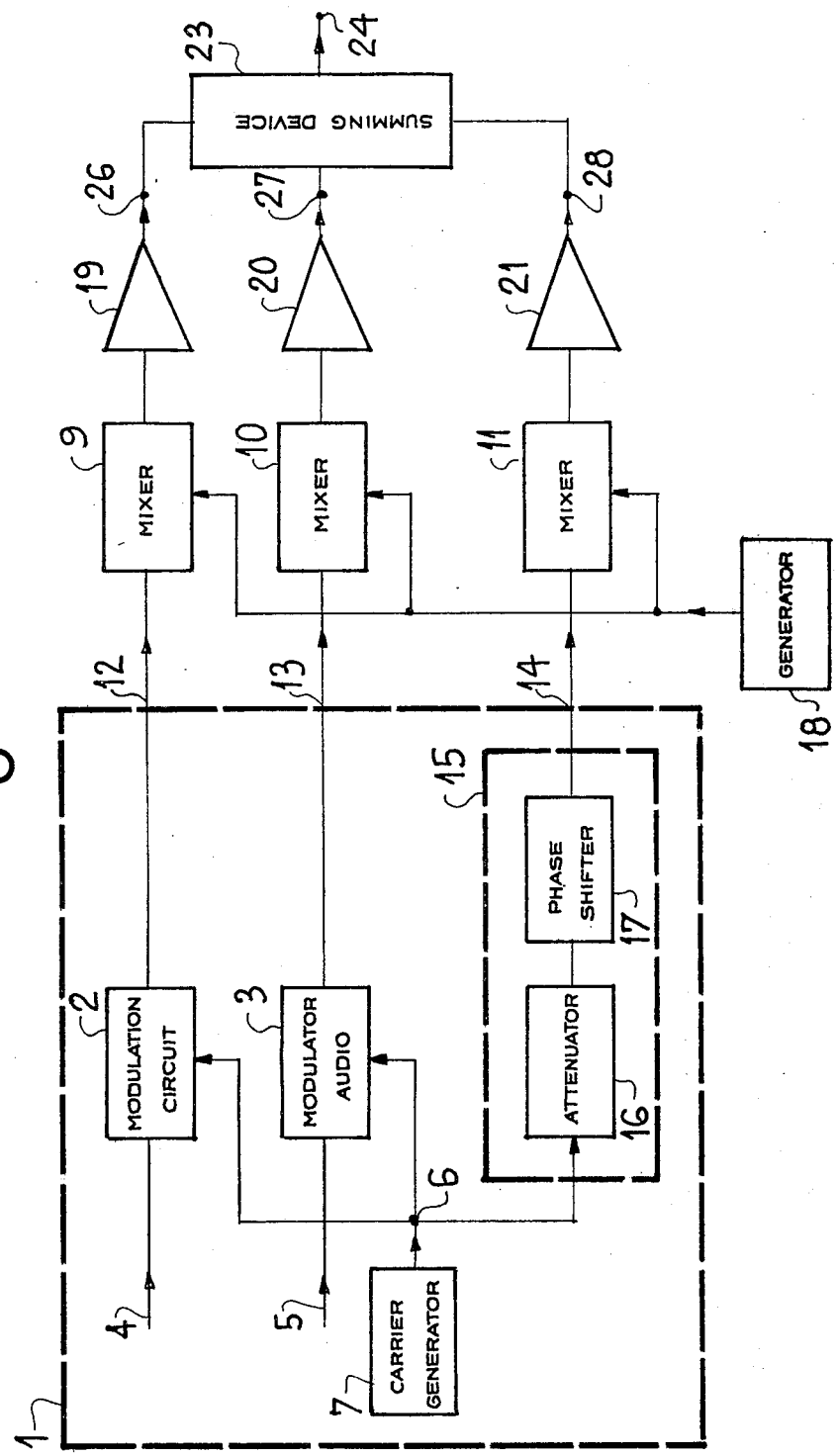

In FIG. 1, a generating device 1 comprises a circuit 2 for the modulation of video-frequency signals and an audio-frequency signal modulator 3. The image signal its applied to a first input 4 of the circuit 2 and the sound signal of a television program is applied to a first input 5 of the circuit 3. The second inputs of these modulating circuits receive in parallel the signal which is delivered on the output terminal 6 of an intermediate-frequency carrier signal generator 7. Said generator also supplies a processing circuit 15 comprising a variable attenuator 16 in series with a variable phase-shifter 17.

The output 12 of the modulation circuit feeds a first amplification channel comprising a mixer 9 followed by an amplifier 19, the output 26 of which is connected to a first input of a summing device 23.

Similarly, the output 14 of the circuit 15 feeds a second amplification channel comprising a mixer 11 followed by an amplifier 21, the output 28 of which is connected to a second input of the device 23.

Finally, the output 13 of the modulator 3 supplies a third amplification channel comprising a mixer 10 followed by an amplifier 20, one output 27 of which is connected to a third input of the device 23, the output 24 of which is that of the transmission system.

Each mixer 9, 10 and 11 has an additional input; all three of these latter are connected in parallel to a translation frequency generator 18.

The unit described in the foregoing constitutes a television transmitter having separate picture and sound channels and is distinguished from known structures by the third channel (mixer 11, amplifier 21) which delivers the unmodulated video-frequency carrier signal at the final transmission frequency with an amplitude and a phase which are respectively adjusted by the attenuator 16 and the phase shifter 17 before being added within the summing device 23 to the modulated signal which is generated by the modulator 2 with a low carrier level.

The output of the summing device 23 thus restores the spectrum of the standard television signal at the output.

The advantage of this arrangement will be brought out by the following description of one exemplified embodiment of the modulation circuit 2 and of the summing device 23.

Figure 2:
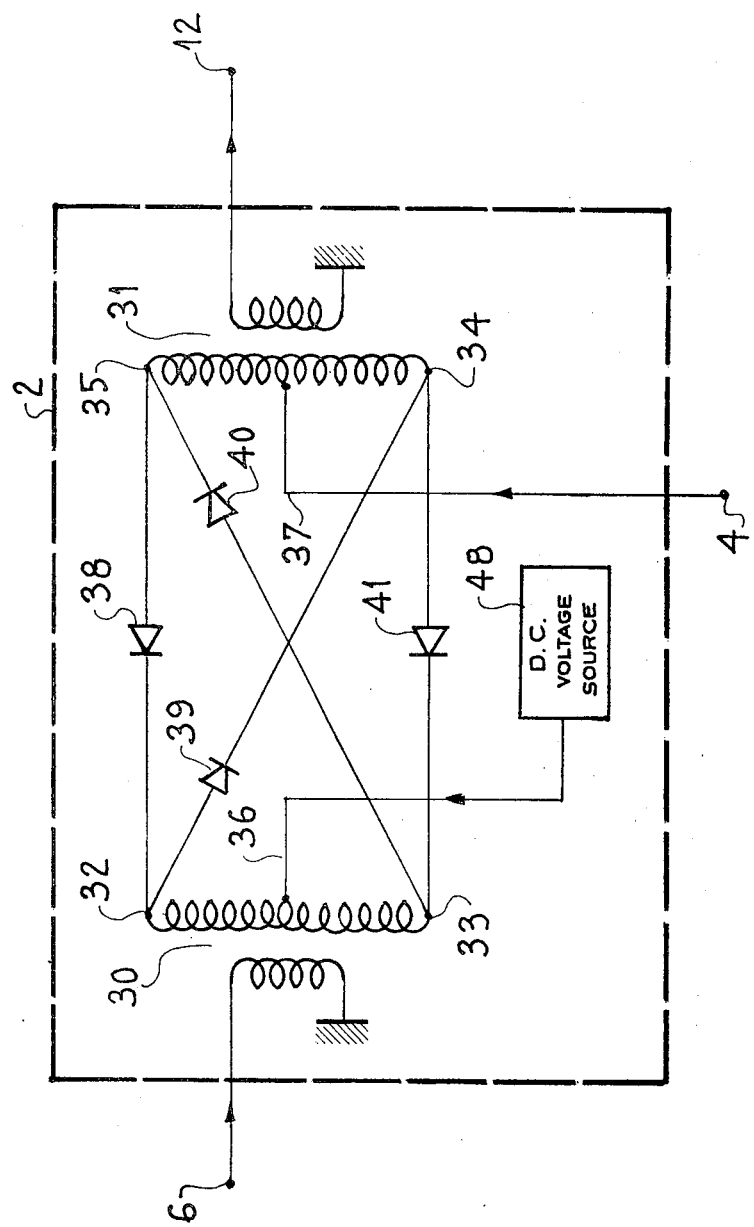

In FIG. 2, the modulation circuit 2 is constituted by a ring modulator comprising a transformer 30, the asymmetrical primary winding of which receives the intermediate-frequency carrier signal applied to the input terminal 6, a transformer 31 whose asymmetrical secondary winding is connected to the output terminal 12 which is common to the circuit 2 and to the modulating device 1 (shown in FIG. 1). Between the symmetrical secondary winding of the transformer 30 having endpoints 32 and 33 and mid-point 36 and the symmetrical primary winding of the transformer 31 having endpoints 34 and 35 and a mid-point 37 are mounted four semiconductor diodes 38 to 41 as shown in FIG. 1 in accordance with the arrangement adopted in all conventional ring modulators. An adjustable direct-current voltage source 48 is connected to the mid-point 36 and the video modulation signal is applied to the mid-point 37 from the input terminal 4.

It will first be assumed that there is a zero potential difference between the points 36 and 37 of the modulator. An alternating-current voltage applied at 6 will develop two voltages which are equal at each instant and of opposite sign, respectively at each end-point 32 and 33 of the secondary winding of the transformer 30, thus causing the simultaneous appearance of two equal and opposite voltages at one of the terminals 34 or 35. The voltages just mentioned will appear, for example, at the terminal 35 through the diodes 38 and 40 which will both be in the conducting state, at the instant at which a negative voltage appears at the terminal 32 and an equal and opposite voltage appears at the terminal 33.

Thus no signal will be delivered at the output terminal 12.

If a voltage U such as a positive voltage, for example, is applied to the point 37 with respect to the point 36, and if the signal applied to the input 6 has an amplitude which is greater than said voltage, the diodes 38 and 41 will be caused to conduct and the diodes 39 and 40 will be caused to cut-off in respect of any instantaneous absolute value of the input signal which is either equal to or lower than U and is then transmitted in phase between the end-points 35 and 34 with respect to the voltage present between the end-points 32 and 33. When the absolute value of the input signal exceeds the value U, the diodes are alternately caused to cut-off or to conduct according to the bias of the input signal, the operation previously described takes place, and any increase in voltage above the value U is reduced to zero by putting equal voltages in opposition.

There is thus collected on the output terminal 12 a clipped intermediate-frequency signal, the amplitude of which is equal or proportional to the value U (as a function of the turns ratio of the transformer 31) and which is in phase with the input signal if the value U is positive (diodes 38 and 41 in the conducting state), and in opposite phase if the value U is negative.

The operation obtained by superimposing a video-frequency signal on said direct-current voltage will be explained with reference to the diagrams of the following figure.

In FIG. 3, FIGS. 3a, 3b and 3c represent the same video-frequency signal comprising two synchronizing pulses 53 and 54 between which the luminance curve 55 is assumed to vary linearly from absolute black to absolute white. FIGS. 3d, 3e and 3f represent the modulated signals obtained at the output terminal 12 of the modulator in respect of different values of the direct-current voltage delivered at the output of the generator 48 with respect to ground. It is assumed that the video-frequency signal is a positive signal having a relative level: 0 at the peak of the synchronizing pulse, 0.3 at the back porch 60, and 1 at the absolute-white level 61.

When the voltage delivered by the generator 48 is zero as represented by the line 50 (in FIG. 3a), the potential of the point 37 (FIG. 2) is continuously positive or zero with respect to the point 36 in the case of any point of the video-frequency signal. There is then obtained the modulated signal shown in FIG. 3d which corresponds to the conventional positive modulation; the carrier signal is continuously in phase with the input signal (diodes 38 and 41 in the conducting state in respect of any instantaneous absolute value of the input voltage which is lower than that of the modulation signal applied at the same instant). The amplitude of the carrier signal at the modulation peak has a value of 1 (namely a value which is equal to that of the modulation signal).

If the voltage delivered by the generator 48 is brought to 1, which corresponds to line 51 of FIG. 3b, the modulated signal shown in FIG. 3e is then obtained and, contrary to the previous FIG. 3d, corresponds to conventional negative modulation. Thus the carrier signal is continuously in opposite phase with respect to the input signal (diodes 39 and 40 in the conducting state in respect of any instantaneous absolute value of the input voltage which is lower than that of the modulation signal applied at the same instant).

Finally, in the particular case of FIG. 3c which will be more especially considered hereinafter, the generator 48 delivers a relative level of 0.65 as represented by the line 52 which passes through the center of the luminance curve 55. There is then obtained the modulated signal shown in FIG. 3f. This signal has a low carrier level in which the black levels (60) and white levels (61) modulate a carrier signal of opposite phase with the same amplitude, the relative level of which is $1-0.65=0.35$; the peak of the modulated signal attains $0.35+0.3=0.65$.

The figures show that the modulated signal of FIG. 3e will be obtained from the signal 3f by adding to this latter a simple carrier signal in opposite phase with respect to the input signal and having a peak amplitude equal to $1-0.65=0.35$.

Similarly, the modulated signal of FIG. 3d will be obtained from the same signal 3f by adding to this latter an unmodulated carrier signal which is in phase with the input signal and has a peak amplitude equal to $1-0.35=0.65$.

The following figure shows one example of construction of the summing device 23 which carries out in particular the addition of the modulated and unmodulated video-frequency signals.

In FIG. 4, the signals which are collected respectively at the output 27 of the amplifier 20 and at the output 28 of the amplifier 21 (shown in FIG. 1) are applied to each of the two inputs of a selective diplexer 70.

A 3 dB hybrid coupler 71 has a first pair of combined accesses 72 and 73 connected respectively to the output 26 of the amplifier 19 (FIG. 1) and to the output of the diplexer 70, and a second pair of combined accesses connected respectively to the output 24 of the summing device 23 and to a load impedance Z.

The selective diplexer 70 adds without any appreciable loss the simple video-frequency carrier signal and the signal which is modulated by the audio-frequency information.

The energy of said modulated signal contained in the signals applied to the access 73 is divided into two equal parts by the coupler 71 between the load Z and the output 24. In these signals, there is thus a resultant loss of 3 dB.

In regard to the composition of the simple video-frequency carrier and of the modulated carrier which have the same frequency, the energy lost in the load Z is clearly a function of their amplitude and relative phase. It will be shown that this loss of power is sufficiently small to ensure that the general balance is advantageous and that considerably enhanced efficiency of the transmitter as a whole is obtained.

It is known that 3 dB couplers make it possible to obtain on both accesses of one of the pairs of combined accesses, respectively the sum and the algebraic difference of the two voltages applied respectively to the two accesses of the other pair on condition that their frequencies are identical and their relative phases are equal to $(\pi/2)\pm k\pi$, where k is a positive whole number. $U_1$ and $U_2$ are the amplitudes of the voltages applied at a given instant respectively to the accesses 72 and 73 of the coupler 71, thus representing a total applied power which is proportional to the quantity $Q=U_1^2+U_2^2$. There will be collected on one of the accesses of the other pair a power which is proportional to $A=(U_1-U_2)^2/2$ and on the other access a power which is proportional to $B=(U_1+U_2)^2/2$. In respect of a ratio $C=U_1/U_2$ between the amplitudes of the applied signals, and if is sought to obtain a power B at the output 24, calculation shows that the following relations must be satisfied:

$$U_1^2 = \frac{2AC^2}{C^2+2C+1} \text{ and } U_2^2 = \frac{2B}{C^2+2C+1}$$

For example, if it is desired to produce the signal of FIG. 3e with negative modulation and maximum peak power corresponding to unity, then it will be necessary to ensure that B=1 with $C=0.65/0.35=1.86$, namely $U_1^2=0.845$ and $U_2^2=0.245$, thus representing a total applied power of approximately 1.09, therefore only approximately 0.4 dB of the total power losses.

It should be pointed out that the maximum peak level of the reduced-carrier modulated signal, that is to say at the peak of the synchronizing pulse, is thus 15.4% lower at the output of the amplifier 19 than that of the same amplifier which delivers the normal signal in negative modulation.

It should also be observed, however, that the balance is even more advantageous at the level of absolute black or of absolute white in negative modulation.

$U_2^2$ remains unchanged in respect of an identical value of maximum unitary peak power and $U_1^2$ is therefore equal in this case to $U_1^1=U_2^2 32\ 0.245$, with a zero dissipated power in the load.

Under these conditions, the modulated signal amplifier 19 will therefore deliver a power which is lower by one-half the value which it would deliver in normal modulation, in which it should be equal to $(0.7)^2=0.49$.

Experience also shows that the particular shape of the modulated signal shown in FIG. 3f in which the levels of absolute black and white are equal and the medium gray level is zero is well suited to class AB amplification with an efficiency which is considerably higher than the usual values in conventional modulation.

Whereas a conventional transmitter has an efficiency of approximately 18% in video-frequency with VHF waves or UHF waves, which represents a supply power of 5.5 in the case of an arbitrary useful peak power equal to unity, the system in accordance with the invention delivers the same unitary peak power from a useful power of simple carrier signal equal to 0.245 obtained in class C by the amplifier 21 with 65% of the efficiency or 0.38 of the corresponding supply power, and from a useful power at the peak of the modulated signal with reduced carrier level of 0.845 which is obtained by the class AB amplifier 19 with an efficiency of approximately 36%, namely 2.35 of the supply power. This accordingly results in a total supply power of 2.73 and in an overall efficiency of 36.5% which is therefore doubled with respect to conventional structures employed up to the present time.

The efficiency of the transmitter under utilization conditions, that is, in transmission of a medium gray image is even further enhanced to a considerable extent by making use of class AB power stages as is now made possible on the modulated channel by virtue of these novel arrangements.

In regard to transmission of the audio-frequency signals, this is carried out by the summing device 23 with a loss of 3 dB. This drawback can be removed by means of a structure as shown in the following figure.

In FIG. 5, the summing device 23 also comprises the 3 dB coupler 71 and the selective diplexer 70. But the simple video-frequency signal and modulated video-frequency signal are first composed within the coupler 71 before being diplexed by means of selective circuits within the diplexer 70. The audio-frequency signals are then subject only to residual losses arising from imperfections of the elements employed.

The criteria governing the choice between these two solutions are not influenced by the use of modulation with reduced carrier level and are common to those of conventional transmitters in which the cost and accuracy of maintenance involved in a selective diplexer through which the video-frequency signals pass are weighed against a gain of 50% in the power of the sound transmitter.

Figure 7:
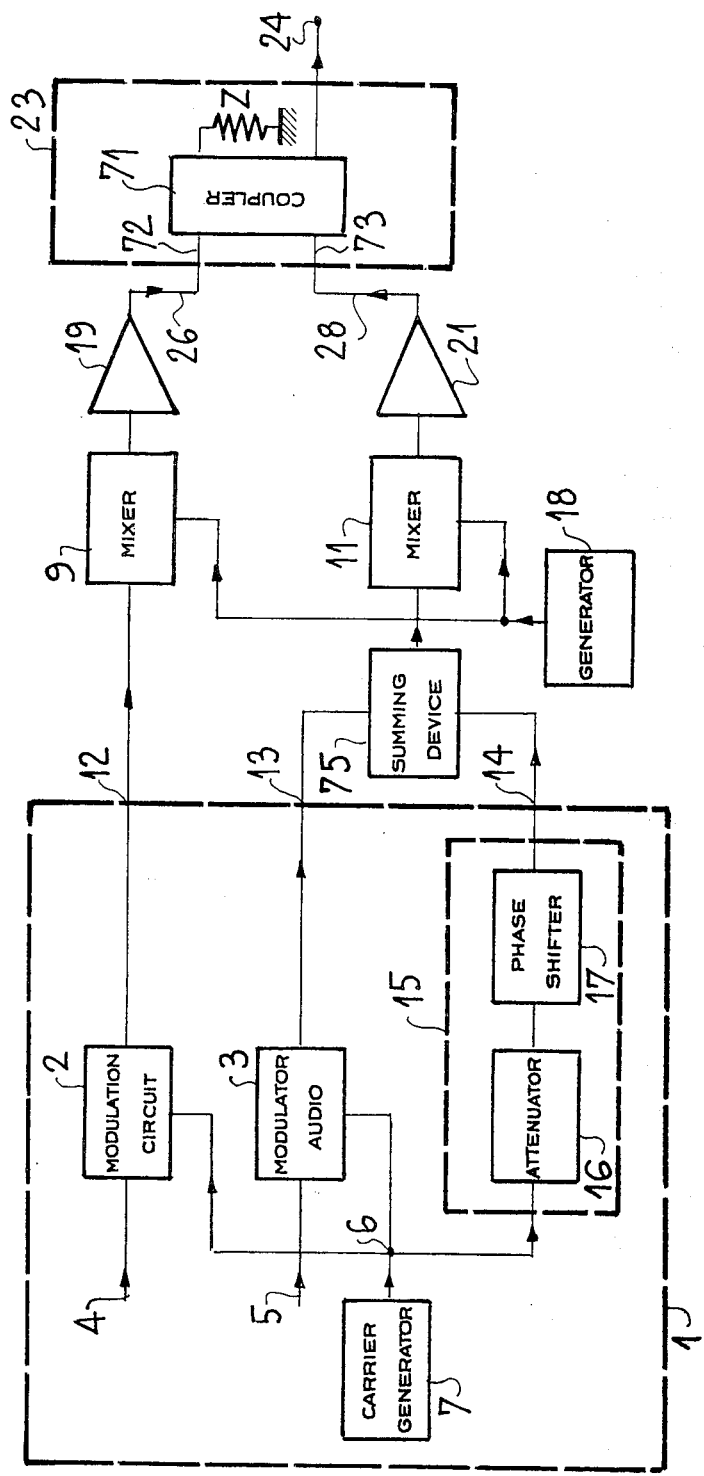

The following FIGS. 6 and 7 show two alternative embodiments of the transmitter of FIG. 1 which are distinguished from each other by the suppression of the amplification channel constituted by the mixer 10 and the amplifier 20 and by simplification of the summing device 23 which comprises only the 3 dB coupler 71, the accesses 72 and 73 of which are connected respectively to the output 26 of the amplifier 19 and to the output 28 of the amplifier 21.

In FIG. 6, the output 13 of the modulator 3 which supplied the suppressed amplification channel is now connected to a first input of a summing device 75, and the connection between the output 12 of the circuit 2 and the mixer 9 is established through a second input and the output of the summing device 75.

FIG. 7 differs from the preceding only in the connection of the summing device 75, the second input of which is connected to the output 14 of the sampling circuit 15 and the output of which is connected to the input of the mixer 11, the direct connection being restored between the output 12 of the circuit 2 and the mixer 9.

The advantage of both structures lies in the simplification of equipment which is thus achieved.

However, the structure of FIG. 7 is a preferred embodiment since it does in fact avoid the strict requirements of linearity of conventional transmitters having a common amplification channel for both picture and sound inasmuch as the audio and video-frequency modulated carrier signals are isolated.

All that has been stated in the foregoing in regard to the composition of the simple and modulated video-frequency carrier signals with reference to FIGS. 1 and 3 remains valid, especially in regard to the advantages arising from the very appreciable improvement in efficiency.

Moreover, the structures shown in FIGS. 1, 6 and 7 are wholly applicable to rebroadcasting transmitters except for the modulation device 1, one example of construction of which is described hereinafter.

In FIG. 8, the generating device 1 comprises a television receiver having an input 80 which receives high-frequency signals from an antenna array (not shown) and supplies in series a mixer 81, an intermediate-frequency amplifier 82, and a separator 83. A first output 84 of said separator delivers at the output 13 of the device the carrier signal which is modulated by the audio-frequency signals and a second output 85 of said separator is connected to the input of an alternative form of the modulation circuit 2. Said input is connected in parallel to a clipping and filtering device 86 and to the first input of an adder 87, the output of which is connected to the output 12 of the device 1. The output of the device 86 is connected on the one hand to the output 14 of the device 1 through the processing circuit 15 and on the other hand to the second input of the adder 87 through a processing circuit 88 which is identical with the circuit 15 described earlier.

The device 86 has the design function of clipping and filtering the carrier signal which is positive or negative modulated in the conventional manner by the video-frequency signals in order to extract therefrom the simple carrier signal which is intended to be applied on the one hand to the corresponding amplification channel (mixer 11 and amplifier 21 of FIGS. 1, 6 and 7) and on the other hand to the circuit 88. By means of the output signal of said circuit 88, the adder 87 is permitted to deliver at its output 12 a modulated signal with reduced carrier such as, for example, the signal shown in FIG. 3f, by adding in opposite phase a simple carrier signal having a relative amplitude of 0.35 if the modulated signal received on the access 89 is of the same type as in FIG. 3e (negative modulation) or having an amplitude of 0.65 if said signal is of the type shown in FIG. 3d (positive modulation).

It has thus been shown that the system in accordance with the invention, which essentially involves separate amplification followed by a combination under predetermined conditions of relative amplitude and phase, of a video-frequency modulated carrier signal having a reduced carrier level with the same unmodulated carrier, is applicable to all television signal transmitters and rebroadcasting transmitters of any type of standard, whether they are provided for black and white signals or color signals, the chrominance subcarrier being only a component of the video-frequency modulation signal and treated as such. This device permits a considerable improvement in efficiency and consequently in reliability in comparison with known transmitters and rebroadcasting transmitters.

As can readily be understood, the diagrams hereinbelow described have been given solely by way of example and many alternative forms of construction or of distribution of levels are possible.

Thus it follows that characteristics of the reduced-carrier modulated signal other than those corresponding to FIG. 3f can accordingly be adopted. Should it be desired to ensure uniform linearity of the entire signal including the synchronizing pulses, it will only be necessary to choose a direct-current voltage of +0.5 as output level of the supply 48 shown in FIG. 2 in order to obtain an identical level in the white and at the peaks of the synchronizing pulses.

Modulators other than that shown in FIG. 2 can be employed. It is well known that a modulated signal having a reduced carrier can be generated by the majority of known modulators by means of a suitable adjustment and that this signal is in fact frequently obtained accidentally at the time of faulty operational adjustments of conventional transmitters.

Finally, the invention is also applicable to television transmitters which do not require any frequency translation of modulated or unmodulated carrier signals whose frequency in that case is equal to the frequency to be transmitted.

What is claimed is:

1. A system for transmission of a composite television signal comprising:
    a generating device for delivering two carrier signals modulated respectively by the audio and video-frequency information which constitutes the television signal,
    at least one first and one second amplification channel,
    and a summing device having at least two inputs coupled respectively to the outputs of the first and second amplification channels and an output constituting the output of the transmission system,
    the generating device being constituted by a modulation circuit and a processing circuit whose outputs deliver respectively the carrier signal which is amplitude-modulated by the video-frequency signals with a reduced video-frequency carrier signal level, and an unmodulated carrier signal, the outputs of the modulation circuit and of the processing circuit being coupled respectively to the inputs of the first and second amplification channels.

2. A transmission system according to claim 1, wherein the processing circuit comprises a variable phase-shifter in series with a variable attenuator, the first and the second amplification channels being each constituted by a converter in series with an amplifier, and the final stage of the amplifier of the first channel being operated in class AB and the final stage of the second channel being operated in class B or C.

3. A transmission system according to claim 2, wherein the summing device comprises at least one 3 dB coupler in which the accesses of the first pair of combined accesses are coupled respectively to the output of the first and second amplification channels, the variable phase-shifter of the processing circuit being so adjusted that the two accesses of the second pair of accesses of the coupler deliver respectively the sum and the algebraic difference of the video-frequency carrier signals delivered respectively by the first and second amplification channels.

4. A television transmitter comprising a transmission system according to claim 1, wherein the modulation circuit comprises a ring modulator having a modulation input which receives the video-frequency information and a carrier signal input, and the generating device further comprises an additional which receives the audio-frequency information and has one carrier-signal input and one output, and a carrier-signal generator coupled in parallel to the two aforesaid carrier-signal inputs and to the processing circuit input.

5. A television transmitter according to claim 4, wherein the input and the output of a third amplification channel are coupled respectively to the output of the additional modulator and to a third input of the summing device, said third channel being constituted by a frequency converter followed by an amplifier.

6. A television transmitter according to claim 4, wherein the output of the modulation circuit is coupled to the first amplification channel through a first input and the output of a summing device whose second input is coupled to the output of the additional modulator.

7. A television transmitter according to claim 4, wherein the output of the processing circuit is coupled to the input of the second amplification channel through a first input and the output of a summing device whose second input is coupled to the output of the additional modulator.

8. A television transmitter according to claim 4, wherein the modulation input of the ring modulator is the bias control input of the modulator diodes, the video-frequency information being applied to the control input in series with a source of adjustable direct-current voltage.

9. A television rebroadcasting transmitter comprising a transmission system according to claim 1, the generating device being further constituted by a television signal receiver comprising in series a mixer fed by high-frequency signals to be received, an intermediate-frequency amplifier and a separator having a first and a second output, the modulation circuit being constituted by clipping and filtering means connected in series with the processing means, and an adder, the input of the clipping means and a first input of the adder being coupled in parallel to the first output of the separator, the output of the processing means being connected to a second input of the adder whose output constitutes the output of the modulation circuit, one input of the processing circuit being coupled to the output of the clipping means, the processing means being constituted by a variable attenuator in series with a variable phase-shifter and the second output of the separator being adapted to deliver the carrier signal which is modulated by the audio-frequency information.

10. A television rebroadcasting transmitter according to claim 9, wherein a third amplification channel comprising a frequency converter followed by an amplifier has one input coupled to the second output of the separator and one output coupled to a third input of the summing device.

11. A television rebroadcasting transmitter according to claim 9, wherein the output of the modulation circuit is coupled to the first amplification channel through a first input and the output of a summing device whose second input is coupled to the second output of the separator.

12. A television rebroadcasting transmitter according to claim 9, wherein the output of the processing circuit is coupled to the input of the second amplification channel through a first input and the output of a summing device whose second input is coupled to the second output of the separator.

* * * * *